United States Patent [19]

Poeppelman et al.

[11] Patent Number: 4,769,788
[45] Date of Patent: Sep. 6, 1988

[54] SHARED LINE DIRECT WRITE NONVOLATILE MEMORY CELL ARRAY

[75] Inventors: Alan D. Poeppelman, Dayton; Raymond A. Turi, Miamisburg, both of Ohio

[73] Assignee: NCR Corporation, Dayton, Ohio

[21] Appl. No.: 910,053

[22] Filed: Sep. 22, 1986

[51] Int. Cl.⁴ .................. G11C 11/40; G11C 11/34; G11C 7/00
[52] U.S. Cl. .................. 365/185; 365/182; 365/189; 365/72
[58] Field of Search ............ 365/189, 182, 185, 104, 365/63, 72; 357/23.5

[56] References Cited

U.S. PATENT DOCUMENTS

| | | | |
|---|---|---|---|
| 4,288,863 | 9/1981 | Adam | 365/182 X |
| 4,387,447 | 6/1983 | Klaas et al. | 365/185 |
| 4,402,064 | 8/1983 | Anakawa | 365/189 |
| 4,462,090 | 7/1984 | Iizuka | 365/185 X |
| 4,486,769 | 12/1984 | Simko | 365/185 |
| 4,616,245 | 10/1986 | Topich et al. | 357/23.5 X |
| 4,628,487 | 12/1986 | Smayling | 365/104 |
| 4,683,554 | 7/1987 | Lockwood et al. | 365/185 X |
| 4,698,900 | 10/1987 | Esguivd | 437/52 X |

FOREIGN PATENT DOCUMENTS 004025 11/1981 European Pat. Off. .

OTHER PUBLICATIONS

Miyamoto et al., "An Experimental 5-V-Only 256-K-bit CMOS EEPROM with a High-Performance Single-Polysilicon Cell", *IEEE Journal of Solid-State Circuits*, vol. SC-21, No. 5, Oct. 1986, pp. 852–859.

*Primary Examiner*—Stuart N. Hecker
*Assistant Examiner*—Alfonso Garcia
*Attorney, Agent, or Firm*—Wilbert Hawk, Jr.; Casimer K. Salys

[57] ABSTRACT

A memory array comprised of floating gate, direct write nonvolatile memory cells having cell interiors which are interconnected by successive adjacent rows to share column lines between adjacent columns of cell and thereby reduce the column line pitch.

12 Claims, 3 Drawing Sheets

SHARED LINE DIRECT WRITE NONVOLATILE MEMORY CELL ARRAY

CROSS REFERENCE TO RELATED APPLICATIONS

This invention is related to U.S. Pat. No. 4,683,554 by inventors Lockwood et al., assigned to the assignee of the present application.

BRIEF SUMMARY

The present invention relates to the structural arrangement of an electronic circuit, and more particularly to an integrated circuit memory array comprised of nonvolatile, single polysilicon, direct write cells interconnected to share columns and thereby provide a higher memory density. The direct write feature allows the programming/writing of new data into a selected cell without the necessity of a preceding erase operation. The preferred arrangement combines in the cell structure a single polysilicon floating gate type charge storage electrode and thin charged transfer dielectric technologies. The sharing of lines for programming/writing and reading operations provides a significant reduction in the column line pitch with a concomitant increase in the array density.

The cells in the array according to the present invention are configured to share column oriented lines for writing, reading and margining operations. Accordingly, the column pitch for the array can be reduced by approximately one third. The individual cells include pairs of select field effect transistors which are connected to independent column lines and enabled by a common row line, a coupling capacitor between the floating gate and a source/drain region of a first select transistor, a sense transistor which shares a source/drain region with a second select transistor and has a gate electrode common to the floating gate, a relatively small charge transfer capacitor connected to the remaining source/drain region of the sense transistor, and a connection between such remaining sense transistor source/drain region of the described cell and the source/drain region of the first select transistor in an immediately adjacent cell of the row.

Writing/programming, reading, and margining of a cell is performed by applying selected voltages to various pairs of columns for the selected cell as well as to one column of the immediately adjacent cell, including as a part of reading the sensing of a conductive path between columns in immediately adjacent cells. Unintended disturbances of the data previously programmed/written into other cells of a selected row are prevented by appropriate biasing all remaining cells in the row being selected.

These and other beneficial features of the structure to which this invention pertains will be more clearly understood upon considering that the ensuing detailed description.

DETAIL DESCRIPTION

Many of the concepts of which underlie the structure, operation and benefits of the single polysilicon, floating gate type nonvolatile memory cell are aptly described by authors Cuppens et al. in the article entitled, "An EEPROM for Microprocessors and Custom Logic", *IEEE Journal of Solid-State Circuits*, Vol. SC-20, No. 2, April 1985, pp. 603–608, and in a paper of the same authorship and title given at the 1984 IEEE International Solid State Circuits Conference on Feb. 24, 1984.

Figure 1:
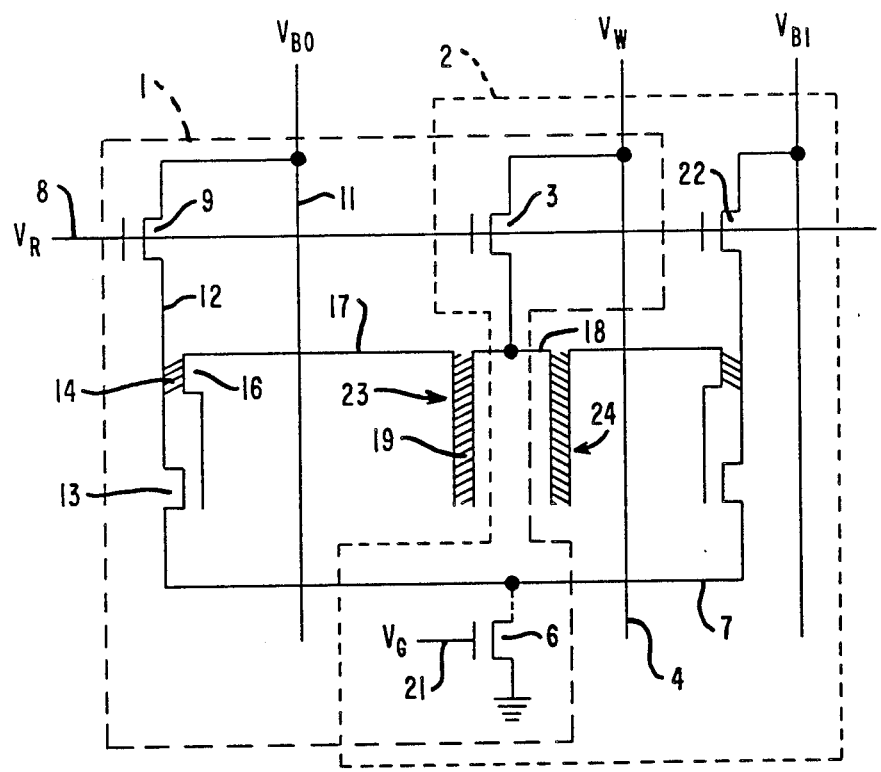
FIG. 1 is a schematic representing a prior art embodiment of a nonvolatile cell.

The composite cell configuration which these references disclose is schematically depicted in FIG. 1 of the drawings. As shown there, a left cell 1, defined by a perimeter of long dashed lines, and a right cell 2, defined by a perimeter of short dashed lines, share access transistors 3 from write line 4 as well as transistor 6, suitable to ground conducting path 7. Left cell 1 is further composed of row line 8 for simultaneously enabling access transistors 3 and 9. Transistor 9 when enabled connects bit line 11 to conductive path 12, which conductive path is preferably a source/drain type diffusion joining access transistor 9 to sense transistor 13. In proximity to diffusion 12, but separated by charge transfer dielectric 14 therefrom, there is situated a segment 16 of conductive floating gate electrode 17, as shown. Floating gate electrode 17 itself extends at the opposite end to a position adjacent similarly diffused conductive path 18, and is of suitable size and proximity to diffusion 18 to provide by way of dielectric 19 an effective capacitive coupling significantly greater than that created by the proximity of electrode segment 16 to diffusion 12. According to the described configuration, 18 is an extension of the source/drain diffusion for transistor 3. The remaining element in the left side of cell 1 is grounding transistor 6, which connects the diffusion type conductive path 7 to ground potential upon receiving an enablement signal on line 21.

One detracting feature of the paired cells depicted in FIG. 1 is the lack of capability to directly write either cell, or stated otherwise, the inability to program the state of the cell to a binary "0" or "1" without undergoing a preceding erase operation. This is attributable to the fact that coupling capacitors 23 and 24 both share line 18, and thereby couple the same line 18 potential to both floating gates. This requires of the potential on line 18 remain fixed during the write/program operation for the data in the non-selected cells to remain in tact. Voltages $V_{B0}$ and $V_{B1}$ are the variables during the write cycle, and the write operation can only transfer charge in one direction. Therefore, this configuration requires that both cells be erased before writing new data into either of the two cells. As one of skill in the art will appreciate, the need for both erase and write cycles to effect the entry of data into a cell, in contrast with a single direct write cycle, increases the functional complexity of the operations to be performed on the chip, and consequently the chip area consumed by the timing and control circuitry.

The two cell configurations depicted in FIG. 1 also suffers from another disadvantage, the potential for having the nonvolatilly stored data disturbed during a read cycle if the read cycle bit line, e.g. $V_{B1}$, and the write line voltages are not the same. The use of such different voltages for $V_{B1}$ and $V_W$ is not uncommon with floating gate devices in that it allows for the centering of the reference level within the memory window. Even minimum amounts of read disturb are considered highly undesirable when repeated read addressing of the cell is possible, such as is common in high clock rate microprocessors operating in looped cycles. On the other hand, the ability to selectively set the voltages $V_{B1}$ and $V_W$ during the read cycle is a desirable feature of the nonvolatile data is to be stored and reliably retrieved over an extended time period, namely after the memory window decreases.

With the pursuit of higher memory cell densities in semiconductor integrated circuit devices, which memory densities are routinely constraint by the pitch of the column or row lines used to address the cells, the noted prior art illustrates another detracting aspect. Namely, the operationally limited pair of cells still requires six electrically independent addressing lines, whether they be row lines or column lines, to program and read the data in the pair of nonvolatile memory cells. For the specific illustration, these includes the lines identified as $V_{B0}$, $V_{B1}$, $V_W$, $V_R$, $V_G$ and the electrical ground line.

The present structure of a nonvolatile cell memory array retains the benefits of a single polysilicon configuration, provides a direct write capability, avoids the read disturb phenomenon, and with the relation to recent nonvolatile, direct write, no read disturb, single polysilicon memory arrays reduces the column pitch by approximately one-third. These features are obtained by a structural arrangement which interconnects successive adjacent cells in a row and shares a column oriented write line between adjacent cells. Consequently, the present array utilizes in the main body of the array merely two column lines and a single row line to fully address each cell. An additional column line is required at each edge of a stack to take into account the absence of further adjacent cells.

Figure 2:
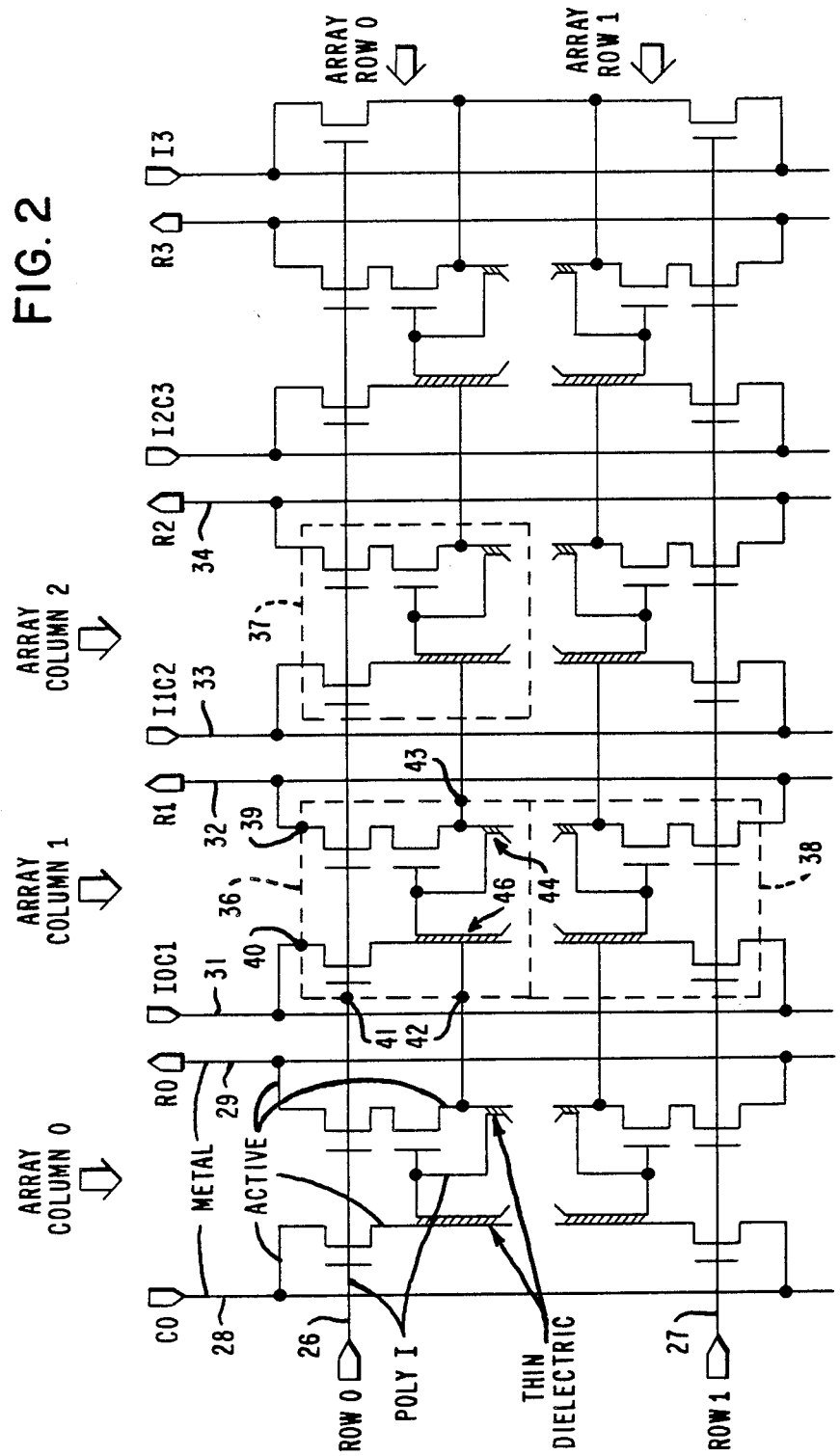
FIG. 2 is an electronic schematic illustrating the interconnection of multiple cells in an array of the form to which this invention pertains.

A nonvolatile memory array configured frcm single polysilicon, direct write cells connected according to the present invention is depicted schematically in FIG. 2 of the drawings. The sample group of cells are arranged in two rows and four columns, responsive to row lines 26 and 27 for respective rows 0 and 1, and paired column lines, such as pair 28 and 29 for column 0, lines 31 and 32 for column 1, and lines 33 and 34 for column 2 of the memory cells. Exemplary nonvolatile memory cells are enclosed within dashed perimeter lines 36, 37 and 38 for memory cells in the respective positions identifiable as row 0/column 1, row 0/column 2 and row 1/column 1.

Directing particular attention to the cell defined by perimeter line 36, note that the cell is accessed through five nodes, numbered 39-43, of which only three nodes, 39-41, are directly addressable from outside the memory array. Remaining nodes 42 and 43 interconnect to cells in adjacent columns. Consequently, the pitch of only two column lines is needed for every column of cells in the array, while functionally, as will be more apparent hereinafter, full program/write and read addressing is performed via three column lines for each cell. For selected cell 36, addressing uses lines 26, 31, 32 and 33, which correspond to lines also identified as ROW 0, I0C1, R1, and I1C2.

For an integrated circuit embodiment, the field effect transistor active regions would preferably employ metal for the column lines, active diffusions in the semiconductor substrate for the source/drain regions, and single layer polysilicon for the gate and floating gate electrodes. A thin dielectric, such as silicon dioxide, silicon nitride or silicon oxynitride would be used for forming the charge transfer regions 44 and capacitive coupling regions 46 in each cell.

Figure 3:
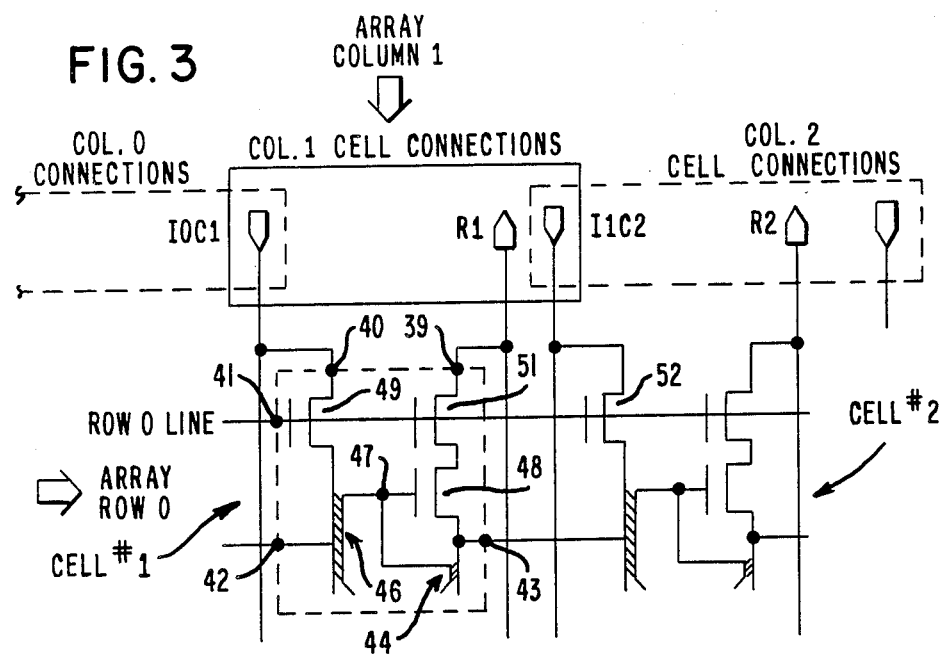
FIG. 3 schematically illustrates the shared column interconnect concept in the context of two adjacent cells.

The structural and operational features of such cells can be more fully appreciated by considering a representative pair of adjacent cells #1 and #2 as illustrated in FIG. 3 of the drawings. The same referenced numerals have been utilized as first applied to the cells situated in ROW 0 of the array of FIG. 2. Representative operating conditions are set forth in Table A below.

TABLE A

| Operating Conditions for the ROW 0/COLUMN 1 Cell | | | | |
|---|---|---|---|---|
| Connection | Write "1"* | Write "0"* | Read (R1 To I1C2 Conduction) | Margin* (R1 To I1C2 Conduction) |
| ROW 0 | +15 V | +15 V | +5 V | +5 V |
| ROW 1 | 0 V | 0 V | 0 V | 0 V |
| COLUMN I0C1 | 0 V | +15 V | 0 V | Test V |
| COLUMN R1 | +15 V/ Float | 0 V/ Float | +1 V | +1 V |
| COLUMN I1C2 | +15 V | 0 V | 0 V | 0 V |

*To prevent unintended disturbance of the data programmed into other cells of a selected row, all columns to the right and to the left of the selected column pair should match the respective right or left selected column voltages (e.g., for ROW 0; set C0 = I0C1 and I3 = I2C3 = I1C2)

The write "0" and "1" operating conditions set forth in Table A are used to program the nonvolatile memory cell, cell #1, for an extended period of time by transferring positive or negative charge onto floating gate electrode 47 through thin dielectric region 44. The highly nonlinear charge transfer characteristics of the thin dielectric region 44 vary with voltage, such that during a write operation in which approximately 10 volts is impressed across the dielectric region charge is transferred between node 43 and floating gate 47. Once transferred, the charge remains trapped on floating gate 47 until removed by a oppositely directed write cycle or by leakage loss over multiple years. The polarity and magnitude of the charge residing on floating gate 47 is detected by the sense field effect transistor 48. The capacitor formed by the thin dielectric 46 between node 42 and floating gate electrode 47 is designed to be significantly greater than the capacitor formed by thin dielectric 44 between node 43 and floating gate electrode 47. The effective coupling ratio ensures that floating gate electrode 47 is pulled, by capacitive coupling, to the potential of node 42. Field effect transistors 49 and 51 provide direct access to cell #1, while further indirect access is provided by field effect transistor 52 in cell #2 via node 43.

Floating gate electrode 47 is capacitively coupled through thin dielectric 46 to the source/drain region of field effect transistor 49, which region is common with node 42. An extension of electrode 47 is coupled to the source/drain region of the field effect transistor 48, which region is in common with node 43. The capacitive coupling through thin dielectric 44 is considerably smaller than the coupling through thin dielectric 46. Thin dielectric 44 also provides a nonlinear charge transfer region. Electrode 47 further extends to form the gate electrode of memory sense field effect transistor 48. Memory sense transistor 48 is an enhancement device preferably having an intrinsic threshold of approximately +1 volt, to facilitate in an n-channel embodiment conduction when the floating gate electrode 47 is positively charged and the absence of conduction therethrough when floating gate electrode 47 is negatively charged.

Connections between the column lines at nodes 39 and 40 and the cell #1 interior is by way of field effect select transistors 49 and 51, which field effect transistors are enhancement mode devices and are responsive to signals on a common gate electrode identified as node 41. Field effect transistor 49 serves to selectively connect node 40 to node 42, while field effect transistor 51 serves to selectively connect node 39 to one source/drain electrode of memory sense transistor 48. Note that nodes 42 and 43 projected in opposite directions along the row line axis to connected to adjacent cells, such as cell #2, to thereby provide means for connecting nodes such as 43 through a select transistor 52 of cell #2 with column line I1C2. Thereby, column line sharing is accomplished.

The sharing of column lines is schematically illustrated at the top of FIG. 3. The concept of column line sharing is portrayed by the fact that the full set of connections to a cell includes the use of a column line from an adjacent column of cells. For example, to write/program, read, and memory margin cell #1 situated in array row 0 and column 1, cell #1 is addressed using the row 0 line corresponding to node 41, column 1 lines I0C1 and R1, and column 2 line I1C2. Note that column 1 line I0C1 is similarly shared by column 0 cells (not shown).

With an understanding of the cell interior structure and the addressing connections at hand, the operation of the representative cell #1 in FIG. 3 will be described with reference to the full complement of conditions as set forth in Table A. Programming of cell #1 to create an nonvolatile state characterized by the conduction of memory sense transistors 48 involves the placement of positive charge on floating gate electrode 47. This corresponds to the write/program "1" conditions set forth in Table A. As defined, row 0 line node 41 is set at +15 volts while row 1 and others of the row lines in the array are set at 0 volts. Concurrently, I0C1 is set at 0 volts, R1 is set to +15 volts or allowed to float, and I1C2 is set at +15 volts. Under these conditions cell #1 is addressed by enabled select transistors 49, 51 and 52 so as to pull node 42 to 0 volts and to pull node 43 to approximately +13 volts. Two volts are dropped in passing through select transistor 52. In view of the materially greater capacitive coupling at 46 over that at 44, floating gate electrode 47 is likewise pulled to the approximately 0 volts of the node 42. In this way, the thin dielectric at 44 is subject to a relative voltage of approximately 10 volts by virtue of the capacitive coupling ratio. This voltage facilitates non-linear Fowler-Nordheim tunneling or Poole-Frenkel conduction, or a combination thereof depending on the dielectric composition, in response to the relatively large electric field impressed across thin dielectric 44. After approximately 1 millisecond the write/programming conditions are removed to leave positive charge trapped on the floating gate electrode 47 for an extended period of time.

The programming of cell #1 to the opposite nonvolatile state, where memory sense transistor 48 is not conducting, follows the application of write/program "0" conditions defined in Table A. Again, row 0 is provided with +15 volts, while other rows are disabled. I0C1 is set at +15 volts, R1 is set at 0 volts or allowed to float, and I1C2 is set at 0 volts. Under these conditions, node 42 and capacitively coupled floating gate electrode 47 are pulled up in voltage toward +13 volts to create an electric field across dielectric 44 of a polarity opposite that previously described, and now initiates a charge transfer in the opposite direction. Following nonlinear charge transfer and removal of the write/program "0" conditions the floating gate electrode 47 is negatively charged. Such negative charge on floating gate electrode 47 disables memory sense transistor 48.

Note that all select transistors in row 0 of the array are enabled when the row line node 41 is bias to +15 volts. To prevent disturbing data written/ programmed into other memory cells in row 0 during the programming of the column 1 cell #1, other column line connections must be biased as described in the footnote of Table A. Namely, column lines to the right of the select column must be biased to the voltage coupled into the select cell from the next adjacent right column, such as via node 43. At the same time, the cells to the left of the addressed column must be biased to substantially the same voltage as that conveyed to the next left column cell, for example, via the line of node 42. As a specific example, if cell #1 is to be programmed a "0" state, in accordance to Table A, column lines to the right of I1C2 would be biased to 0 volts while column to the left of I0C1 would be biased to +15 volts. Under these conditions, cells in the adjacent columns would not encounter a material voltage differential which might otherwise disturb or degrade the charge stored on their floating gate electrodes.

The reading of the nonvolatile state programmed into cell #1 in row 0 and column 1 of the array is again accomplished according to the conditions defined in Table A. Row 0 is selected by placing a +5 volt bias on row 0 line node 41 while providing 0 volts to other row lines of the array. During the read operation, column line I0C1 is bias at 0 volts, line R1 is connected to +1 volts, and line I1C2 is connected to 0 volts, while the conductive state in the path between connections R1 and I1C2 is sensed. Because the conductive state of memory sense transistor 48 is being detected between column line connections R1 and I1C2, the +1 volts connection R1 is discretionary, in that it can be higher or lower depending on the design of the current sensing circuit. Note that the conduction between a R1 and I1C2 is bi-directional. In this respect, also note that the amplitudes of the voltages supplied to R1 and I1C2 can be interchanged. However, it is important that column line connections to the right of I1C2 be held at the voltage of I1C2 and that column line connections to the left of R1 be held at the voltage of R1 to minimize any disturbance effects on the nonvolatile state programmed into the cell #2 during the read operation.

The present invention also allows a testing of a memory window to measure the extent of charge retained on floating gate electrode 47. Following the conditions prescribed in Table A, R1 would again be biased at +1 volts while I1C2 is held at 0 volts and conduction therebetween is being sensed. For the margin condition, however, a test voltage would be applied to I0C1 so as to detect when field effect sense transistor 48 commences conduction. The test voltage on I0C1 should also be applied to all columns left of I0C1 to avoid disturbing the data in adjacent cells of the row. The test voltage on I0C1 is coupled through the capacitor formed by dielectric 46 to floating gate 47 in order to shift the relative potential of electrode 47.

Figure 4:
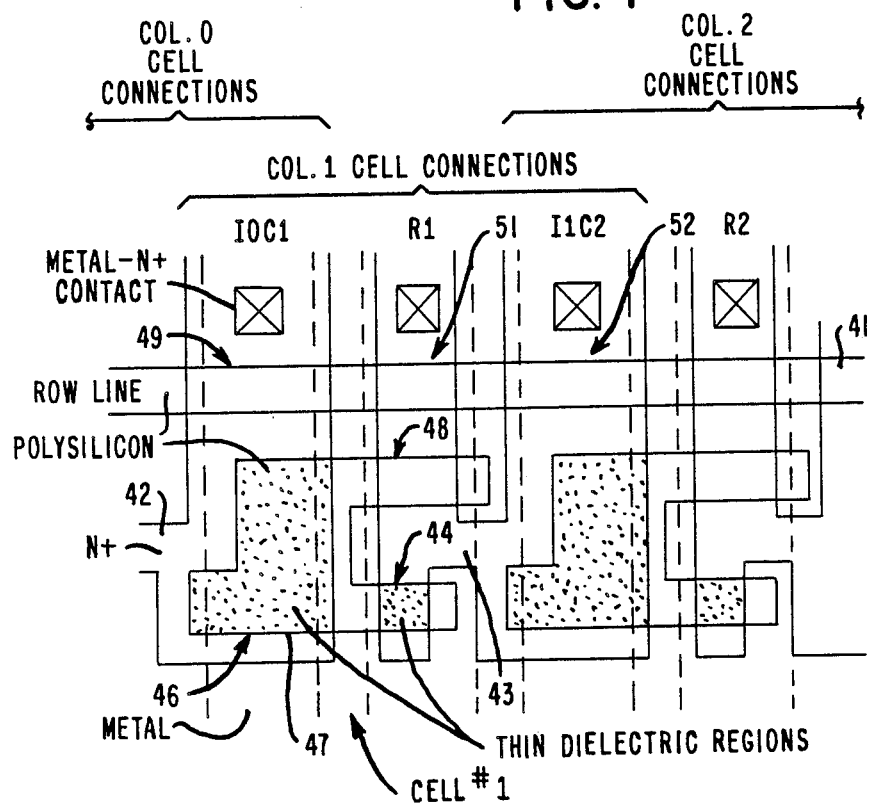
FIG. 4 is a schematic representation of an exemplary layout for the two cells depicted in FIG. 2.

FIG. 4 presents an exemplary layout for the cells schematically depicted in FIG. 3, to further illustrate how the sharing of column lines by coupling of row lines facilitates a reduction of the column pitch in a cell which provides nonvolatile data storage, direct write operating capability, an absence of read disturb, and a single conductively doped polysilicon integrated circuit structure. The n+conductive regions diffused in the substrate are defined by solid lines, as are the first layer polysilicon regions. The intersection of the polysilicon row line with the n+conductors form the select transistors 49, 51 and 52. The thin dielectric shown by stiple in region 46 defines the area of large capacitive coupling between the n+conductive region and the polysilicon, while the thin dielectric with low capacitive coupling in region 44 defines the charge transfer region between the n+conductive region and the polysilicon floating gate electrode 47. The placement of the metal column lines is shown by dash lines with metal to n+connections being shown by contacts in respective column lines. The sharing of column line connections is schematically diagrammed at the head of the figure.

Though illustrated by specific embodiment, the invention should be broadly interpreted to encompass those variations of structure which retain the central features of the invention as reasonably interpreted from the claims.

We claim:

1. An array of multiple nonvolatile memory cells configured in a matrix, comprising:
   row select lines for addressing memory cells in a common row of the array;
   a first column line selectively connected to a first cell in a first row of the array;
   a second column line selectively connected to the first cell for reading the nonvolatile state stored therein;
   a third column line selectively connected to a second cell on one side of the first row of the array; and
   means for capacitively coupling electrical signals between the third column line and the first cell, and between the first column line and a third cell, the third cell positioned on the opposite side of the first cell and in the first row of the array.

2. The array recited in claim 1, further including:
   means for voltage biasing the first and third column lines with voltages suitable to program the first cell.

3. The array recited in claim 2, further including:
   means for voltage biasing the second and third column lines with voltages suitable to read the nonvolatile states stored in the first cell.

4. The array recited in claim 3, wherein the first and second cells in the array include individual but commonly enabled select transistor for selectively connecting the cells to the first, second and third column line.

5. The array recited in claim 4, further including:
   means for voltage biasing the column lines of the third cell and those first row cells successively connected thereto at the voltage of the first column line, and for voltage biasing the column lines of the second cell and those first row of cells successively connected thereto at the voltage of the third column line.

6. The array recited in claim 5, wherein a field effect memory sense transistor is conductively connected between the select transistors in the second and third column lines and is conductively responsive to the nonvolatile state stored in the first cell.

7. The array recited in claim 6, wherein:
   the first column line select transistor is a field effect device conductively connected between the first column line and a first conductive region in a semiconductor substrate;
   the second column line select transistor is a field effect device conductively connected between the second column line and the memory sense transistor, which memory sense transistors is on its opposite side connected to a second conductive region in a semiconductor substrate; and
   the third column line select transistor is a field effect device conductively connected between the third column line and the second conductive region.

8. The array recited in claim 7, wherein the gate electroe of the field effect memory sense transistor is capacitively coupled to the first and the second conductive regions to facilitate transfer of charge to and from the gate electrode.

9. The array recited in claim 8, wherein the capacitive coupling to the first and second conductive regions is materially different.

10. An array of multiple nonvolatile memory cells, comprising:
    a matrix of row and column lines for selectively addressing the cells to program a selected cell to a first binary state, to program the selected cell to a second, opposite binary state, or to read the binary state stored in the selected cell;
    the numerical count of the row lines is equal to the number of rows of cells in the array;
    the numerical count of the column lines is one greater than twice the number of columns of cells in the array; and
    adjacent cells in successive columns of a row of cells are capacitively connected to share adjacent column lines.

11. The array recited in claim 10, wherein:
    the nth cell of a designated row in the array is programmed with the concurrence of electrical signals on the designated row line, a first column line for the nth cell, and a first column for the n+1 th cell; and
    the nth cell of a designated row in the array is read by sensing conduction between a second column line for the nth cell and the first column of the n+1 th cell in concurrence with a designated row line signal.

12. The array recited in claim 11, wherein the nth cell of the designated row is margined by sensing conduction between the second column line for the nth cell and the first column line for the n+1 th cell, in concurrence with the designated row line signal and a margin test voltage on the first column line of the nth cell.

* * * * *